(12) United States Patent
Ye (10) Patent No.: US 12,063,822 B2
(45) Date of Patent: Aug. 13, 2024

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Jian Ye, Wuhan (CN)

( * ) Notice: Subject to any disclaimer, the term of this patent is extended or adjusted under 35 U.S.C. 154(b) by 0 days.

(21) Appl. No.: 17/599,611

(22) PCT Filed: Aug. 30, 2021

(86) PCT No.: PCT/CN2021/115273
§ 371 (c)(1),
(2) Date: Sep. 29, 2021

(87) PCT Pub. No.: WO2023/000439
PCT Pub. Date: Jan. 26, 2023

(65) Prior Publication Data
US 2024/0032350 A1 Jan. 25, 2024

(30) Foreign Application Priority Data
Jul. 20, 2021 (CN) .......................... 202110817295.1

(51) Int. Cl.
*H10K 59/126* (2023.01)
*G06F 3/041* (2006.01)
(Continued)

(52) U.S. Cl.
CPC ......... *H10K 59/126* (2023.02); *G06F 3/0412* (2013.01); *G06F 3/0446* (2019.05);
(Continued)

(58) Field of Classification Search
CPC ......... H01L 23/552; G09F 9/33; G09F 9/301; H10K 59/40; H10K 59/126; H10K 59/131;
(Continued)

(56) References Cited

U.S. PATENT DOCUMENTS

| 2014/0306348 | A1 | 10/2014 | Ahn |
| 2018/0188838 | A1* | 7/2018 | An .......................... H04B 5/72 |
| 2022/0109227 | A1* | 4/2022 | Lee ........................ H01Q 1/243 |
| 2022/0404926 | A1* | 12/2022 | Kim ....................... G06F 3/0412 |

FOREIGN PATENT DOCUMENTS

| CN | 107092400 A | 8/2017 |
| CN | 108417604 A | 8/2018 |
| CN | 109523921 A | 3/2019 |

(Continued)

OTHER PUBLICATIONS

International Search Report in International application No. PCT/CN2021/115273, mailed on Mar. 28, 2022.
(Continued)

*Primary Examiner* — Fazli Erdem (57) ABSTRACT

A flexible display panel and a display device are provided. The display device includes a display area and a bending area located outside the display area. The bending area includes: a first flexible area, a first metal layer, an organic insulating layer, and a second metal layer. The first metal layer includes a plurality of traces, and the second metal layer includes a plurality of metal patterns. Orthographic projections of the plurality of metal patterns on the first flexible area completely cover orthographic projections of the first traces and the second traces on the first flexible area.

20 Claims, 7 Drawing Sheets

(51) Int. Cl.
*G06F 3/044* (2006.01)
*H10K 59/131* (2023.01)
*H10K 59/40* (2023.01)
*H10K 77/10* (2023.01)

(52) U.S. Cl.
CPC ........... *H10K 59/131* (2023.02); *H10K 59/40* (2023.02); *H10K 77/111* (2023.02)

(58) Field of Classification Search
CPC ................ H10K 77/111; G06F 3/0446; G06F 3/0412; G06F 3/04164
USPC ........................................................ 257/72
See application file for complete search history.

(56) References Cited

FOREIGN PATENT DOCUMENTS

| | | | |
|---|---|---|---|
| CN | 110335875 A | 10/2019 |
| CN | 111063257 A | 4/2020 |
| CN | 111459320 A | 7/2020 |
| CN | 111509017 A | 8/2020 |
| CN | 212874543 U | 4/2021 |

OTHER PUBLICATIONS

Written Opinion of the International Search Authority in International application No. PCT/CN2021/115273, mailed on Mar. 28, 2022.
Chinese Office Action issued in corresponding Chinese Patent Application No. 202110817295.1 dated Apr. 16, 2023, pp. 1-6.

* cited by examiner

FIG. 1

Prior Art

FLEXIBLE DISPLAY PANEL AND DISPLAY DEVICE

The present disclosure claims priority to Chinese Patent Application No. 202110817295.1, filed with China National Intellectual Property Administration on Jul. 20, 2021 and entitled "FLEXIBLE DISPLAY PANEL AND DISPLAY DEVICE", which is incorporated herein by reference in its entirety.

FIELD OF INVENTION

The present disclosure relates to the field of display technologies, and in particular, to a flexible display panel and a display device.

BACKGROUND OF INVENTION

Nowadays, in display devices, such as mobile phones, a back surface of an organic light-emitting diode (OLED) panel is usually covered with a black film layer (that is, the so-called IC tape). An area of the black film layer covers a bending area of the folded OLED panel and a printed circuit board area. The black film layer is a composite material. As an electromagnetic interference (EMI) shielding film, the black film layer mainly shields signals of various electronic components on a printed circuit board and an integrated circuit, so as to prevent the signals from being interfered with or the signal radio frequency from interfering with other electrical signals of the antenna of a complete machine, and the like.

Figure 1:
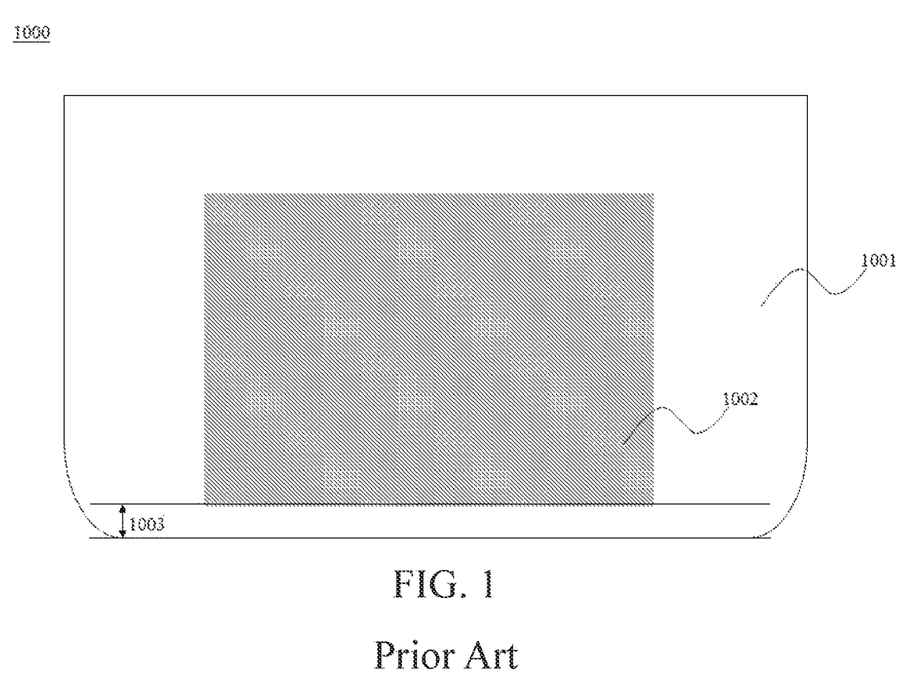
FIG. 1 is a partial schematic diagram of a lower half of an OLED panel in the prior art.

As shown in FIG. 1, FIG. 1 is a partial schematic diagram of a lower half of an OLED panel 1000. A back surface 1001 of the lower half of the OLED panel 1000 is covered with an EMI shielding film 1002. However, products having a bending design at a frame still have the problem of signals being interfered with or the signal radio frequency interfering with the antenna of the complete machine. This causes serious interference to the antenna of the complete machine, the decreasing sensitivity of the antenna, and even the serious radio frequency decreasing sensitivity (RF DE-SENSE).

SUMMARY OF INVENTION

Technical Problem

In the present display device, products having a bend design at the frame have the problem of signals being interfered with or the signal radio frequency interfering with the antenna of the complete machine, causing the technical problem of the decreasing sensitivity of the antenna.

Technical Solution

An objective of the present disclosure is to provide a flexible display panel and a display device, so as to resolve the technical problem of the decreasing sensitivity of the antenna as a result of the problem of signals being interfered with or the signal radio frequency interfering with the antenna of the complete machine for products having a bending design at a frame of the present display device.

In order to resolve the above problem, the present disclosure provides a flexible display panel, including a display area, a bending area located outside the display area, and a flexible substrate. The flexible substrate defines a first flexible area located in the bending area and a second flexible area located in the display area. The bending area further includes:

a first metal layer, disposed on the first flexible area;
an organic insulating layer, disposed on the first metal layer; and
a second metal layer, disposed on the organic insulating layer, wherein
the first metal layer includes a plurality of first traces and a plurality of second traces, the first traces are located on a first side of the bending area, and the second traces are located on a second side of the bending area; and
the second metal layer includes a plurality of metal patterns, and orthographic projections of the plurality of metal patterns on the first flexible area cover orthographic projections of the first traces and the second traces on the first flexible area.

In an embodiment of the present disclosure, in the display area, the flexible display panel further includes:

a circuit device layer, disposed above the second flexible area;
a display device layer, disposed above the circuit device layer;
a packaging layer, disposed above the display device layer; and
a touch layer, disposed above the packaging layer and including first touch electrodes and second touch electrodes, wherein
the touch layer further includes third traces electrically connected to the first touch electrodes and fourth traces electrically connected to the second touch electrodes, the third traces are electrically connected to the first traces through first vias provided at an edge of the bending area, and the fourth traces are electrically connected to the second traces through second vias provided at the edge of the bending area.

In an embodiment of the present disclosure, the metal patterns include a first metal block and a second metal block, the first metal block corresponds to the first traces, and the second metal block corresponds to the second traces; and an orthographic projection of the first metal block on the first flexible area completely covers the orthographic projections of the first traces on the first flexible area, and an orthographic projection of the second metal block on the first flexible area completely covers the orthographic projections of the second traces on the first flexible area.

In an embodiment of the present disclosure, a length of the first metal block and a length of the second metal block each are greater than or equal to a bending length of the bending area, a width of the first metal block is greater than or equal to a sum of widths of and spacings among the plurality of first traces, and a width of the second metal block is greater than or equal to a sum of widths of and spacings among the plurality of second traces.

In an embodiment of the present disclosure, the metal patterns include a plurality of first metal wires and a plurality of second metal wires, each first metal wire corresponds to one first trace, and each second metal wire corresponds to one second trace; and orthographic projections of the first metal wires on the first flexible area completely cover the orthographic projections of the first traces on the first flexible area, and orthographic projections of the second metal wires on the first flexible area completely cover the orthographic projections of the second traces on the first flexible area.

In an embodiment of the present disclosure, a length of each first metal wire and a length of each second metal wire each are greater than or equal to a bending length of the bending area, a width of the each first metal wire is greater than or equal to a width of each first trace corresponding to the each first metal wire, and a width of the each second metal wire is greater than or equal to a width of each second trace corresponding to the each second metal wire.

In an embodiment of the present disclosure, each metal pattern has a constant potential.

In an embodiment of the present disclosure, the circuit device layer located in the display area includes a metal gate layer, a first source/drain layer disposed on the metal gate layer, and a second source/drain layer disposed on the first source/drain layer; and in the bending area, the first metal layer is formed by extending the first source/drain layer, and the second metal layer is formed by extending the second source/drain layer.

In an embodiment of the present disclosure, the flexible display panel further includes a non-display area located between the display area and the bending area, and the non-display area includes the metal gate layer, the first source/drain layer, and the second source/drain layer that extend from the display area; and in the non-display area, data lines or gate lines are disposed on the metal gate layer, power voltage lines are disposed on the first source/drain layer, the third traces and the fourth traces are disposed on the second source/drain layer, and the third traces and the fourth traces are disposed corresponding to the power voltage lines.

In an embodiment of the present disclosure, the metal patterns include metal blocks and metal wires.

The present disclosure further provides a display device, including the above flexible display panel and a main board disposed below the flexible display panel, wherein an antenna is disposed on the main board, and the antenna corresponds to the bending area.

Beneficial Effects

The beneficial effect of the present disclosure is that, by additionally disposing a second metal layer above the traces in the bending area, the metal blocks or metal wires that are formed by patterning the second metal layer correspond to the traces. That is, the orthographic projections of the plurality of metal blocks or the plurality of metal wires on the first flexible area completely cover the orthographic projections of the first traces and the second traces on the first flexible area. In this way, the interference of signal noise of the traces on the antenna of the complete machine as a result of the traces in the bending area incapable of being covered by the shielding film can be effectively reduced.

BRIEF DESCRIPTION OF DRAWINGS

The following describes specific implementations of the present disclosure in detail with reference to the accompanying drawings, to make the technical solutions and other beneficial effects of the present disclosure obvious.

DETAILED DESCRIPTION OF PREFERRED EMBODIMENTS

Technical solutions in the embodiments of the present disclosure are clearly and completely described below with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure.

In the description of the present disclosure, it should be understood that orientation or position relationships indicated by the terms such as "center", "longitudinal", "transverse", "length", "width", "thickness", "on", "below", "front", "back", "left", "right", "vertical", "horizontal", "top", "bottom", "inside", "outside", "clockwise", and "anti-clockwise" are based on orientation or position relationships shown in the accompanying drawings, and are used merely for ease and brevity of illustration and description, rather than indicating or implying that the mentioned apparatus or component must have a particular orientation or must be constructed and operated in a particular orientation. Therefore, such terms should not be construed as a limitation to the present disclosure. In addition, terms "first" and "second" are used merely for the purpose of description, and shall not be construed as indicating or implying relative importance or implying a quantity of indicated technical features. Therefore, features defined by "first" and "second" may explicitly or implicitly include one or more of the features. In the descriptions of the present disclosure, "a plurality of" means two or more, unless otherwise definitely and specifically limited.

In the accompanying drawings, components with the same structure are denoted by the same numerals, and components with similar structures or functions are denoted by similar numerals. In addition, for ease of understanding and description, the size and thickness of each component shown in the accompanying drawings are arbitrarily shown, but the present disclosure is not limited thereto.

When some components are described as being "on" another component, the component may be directly disposed on another component; there may also be an intermediate component on which the component is disposed, and the intermediate component is disposed on another component. When a component is described as "installed to" or "connected to" another component, both can be understood as directly "installed" or "connected", or a component is "installed to" or "connected to" another component by using an intermediate component.

The following clearly and completely describes the technical solutions of the present disclosure with reference to specific embodiments.

As shown in FIG. 1, FIG. 1 is a partial schematic diagram of a lower half of an OLED panel 1000. A back surface 1001 of the lower half of the OLED panel 1000 is covered with an EMI shielding film 1002. After repeated verification by the inventor, it is found that products having a bending design at a frame still have the problem of signals being interfered with or the signal radio frequency interfering with the antenna of the complete machine. This is because the bending area 1003 cannot be completely covered by the EMI shielding film 1002. Therefore, the noise of touch signals in the bending area 1003 affects nearby low-frequency or intermediate-frequency antennas. This causes serious interference to the antenna of the complete machine, the decreasing sensitivity of the antenna, and even the serious RF DE-SENSE.

Figure 2:
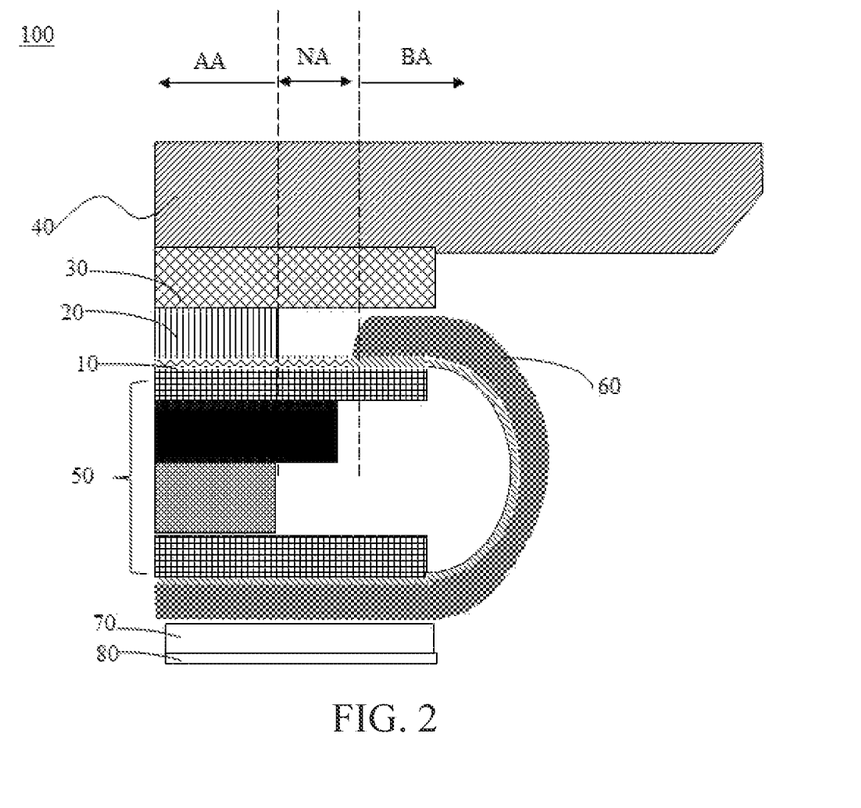
FIG. 2 is a schematic diagram of a structure of a display device according to an embodiment of the present disclosure.

Therefore, the present disclosure provides a flexible display panel 10 and a display device 100 to solve the above problems. As shown in FIG. 2, the display device 100 may be a wearable device, such as a smart bracelet, a smart watch, virtual reality, or the like. The display device may alternatively be a mobile phone, an e-book, an electronic newspaper, a television, or a personal portable computer. The display device may further be a flexible OLED display or lighting device that is bendable and foldable. The embodiment of the present disclosure does not limit a detailed form of the display device.

The display device 100 includes the flexible display panel 10, a polarizer 20, an optical adhesive 30, and a cover plate 40. Optionally, the display device 100 may further include a support layer 50 and a protective layer 60.

The flexible display panel 10 includes a display area AA and a bending area located outside the display area AA. A non-display area NA is further disposed between the display area AA and the bending area BA. A plurality of circuits configured to implement functions, such as signal transmission and driving image display are disposed in the non-display area NA and the bending area BA. The flexible display panel 10 includes a flexible substrate. The flexible substrate defines a first flexible area 1 located in the bending area BA and a second flexible area 101 located in the display area AA.

The polarizer 20 is disposed on a side of the flexible display panel 10 that is away from the support layer 50, and covers at least the display area AA to filter out light. In another embodiment of the present disclosure, the polarizer 20 may also be replaced with a color filter. The color filter is used to replace the polarizer to prevent the light leakage of the display device and to reduce the reflectivity of the display device.

The cover plate 40 is disposed on a side of the polarizer 20 that is away from the flexible display panel 10. The cover plate 40 covers at least the display area AA, and is connected to the polarizer 20 using the optical adhesive 30. The optical adhesive 30 is used to bond optical elements. The optical adhesive 30 may be an optical clear adhesive (OCA) having the characteristics of colorless and transparent, light transmittance of above 90%, desirable bonding strength, a capability of being cured at a room temperature or a medium temperature, small curing shrinkage, and the like. In the embodiment of the present disclosure, the optical adhesive 30 is used to bond the cover plate 40 to the polarizer 20. The cover plate 40 is configured to protect the flexible display panel 10 from damage by an external impact force.

The support layer 50 is mainly used to fix and support the flexible display panel 10 to prevent the flexible display panel 10 from breaking as a result of being excessively bent.

The protective layer 60 is disposed on a side of the flexible display panel 10 that is away from the support layer 50, and completely covers the bending area BA of the flexible display panel 10, thereby reducing the bending stress of the bending area BA. The protective layer 60 is a UV adhesive. Certainly, in other embodiments, the protective layer 60 is not limited to the UV adhesive, and may further be a thermal curing adhesive or other types of light curing adhesives. This is not limited in detail in the embodiment of the present disclosure.

A main board 70 is further disposed below the flexible display panel 10 of the display device 100. An antenna 80 is disposed on the main board 70, and is adjacent to the bending area BA.

It may be understood that a side of the flexible display panel 10 that is close to the antenna 80 is usually covered with a metal shielding layer, so as to avoid the decreasing sensitivity of the antenna as a result of the interference, on the antenna of the complete machine, of the signal noise of the circuit or integrated circuit on the flexible display panel 10 that is bent under the support layer 50.

However, since the bending area BA of the flexible display panel 10 cannot be completely covered by the metal shielding layer, the signal noise of the bending area BA seriously interferes with the antenna of the complete machine, causing the decreasing sensitivity of the antenna and serious RF DE-SENSE.

Figure 6:
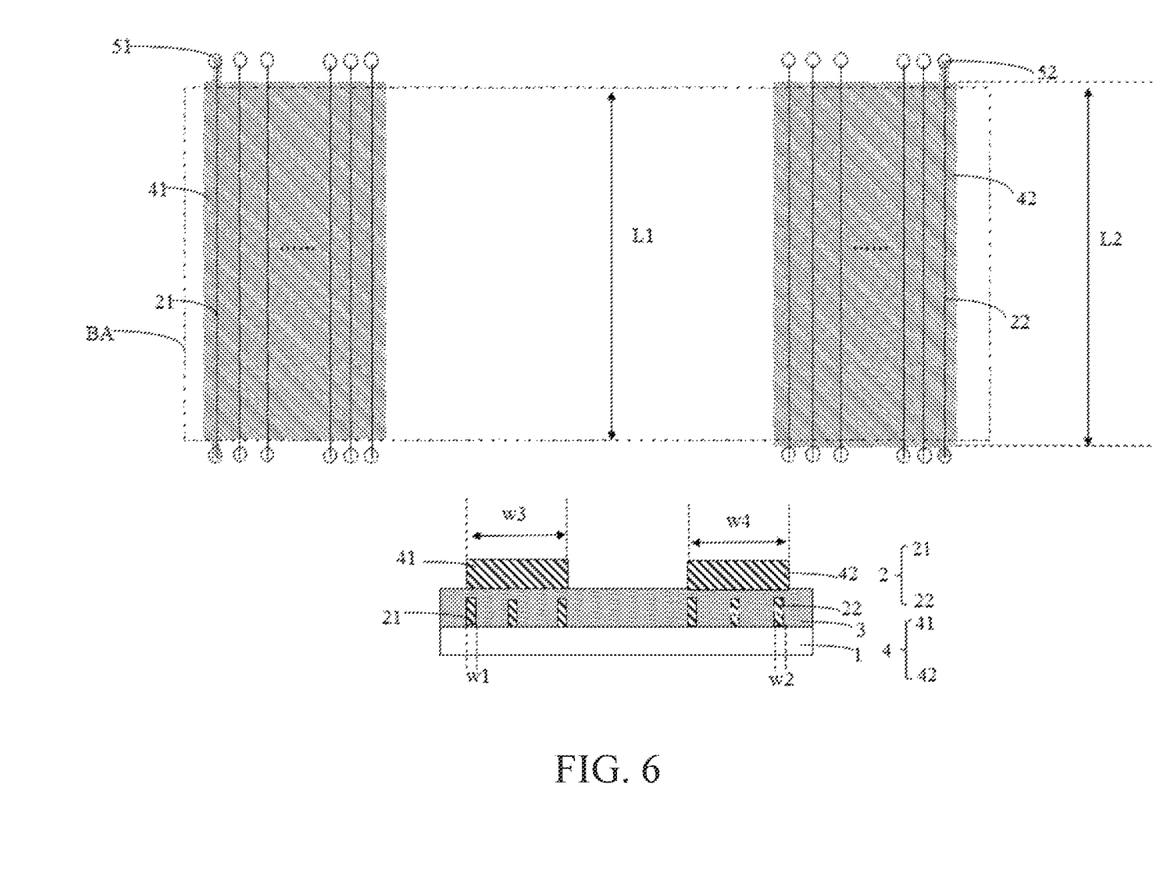
FIG. 6 is a schematic diagram of a first structure of a bending area according to an embodiment of the present disclosure.
Figure 7:
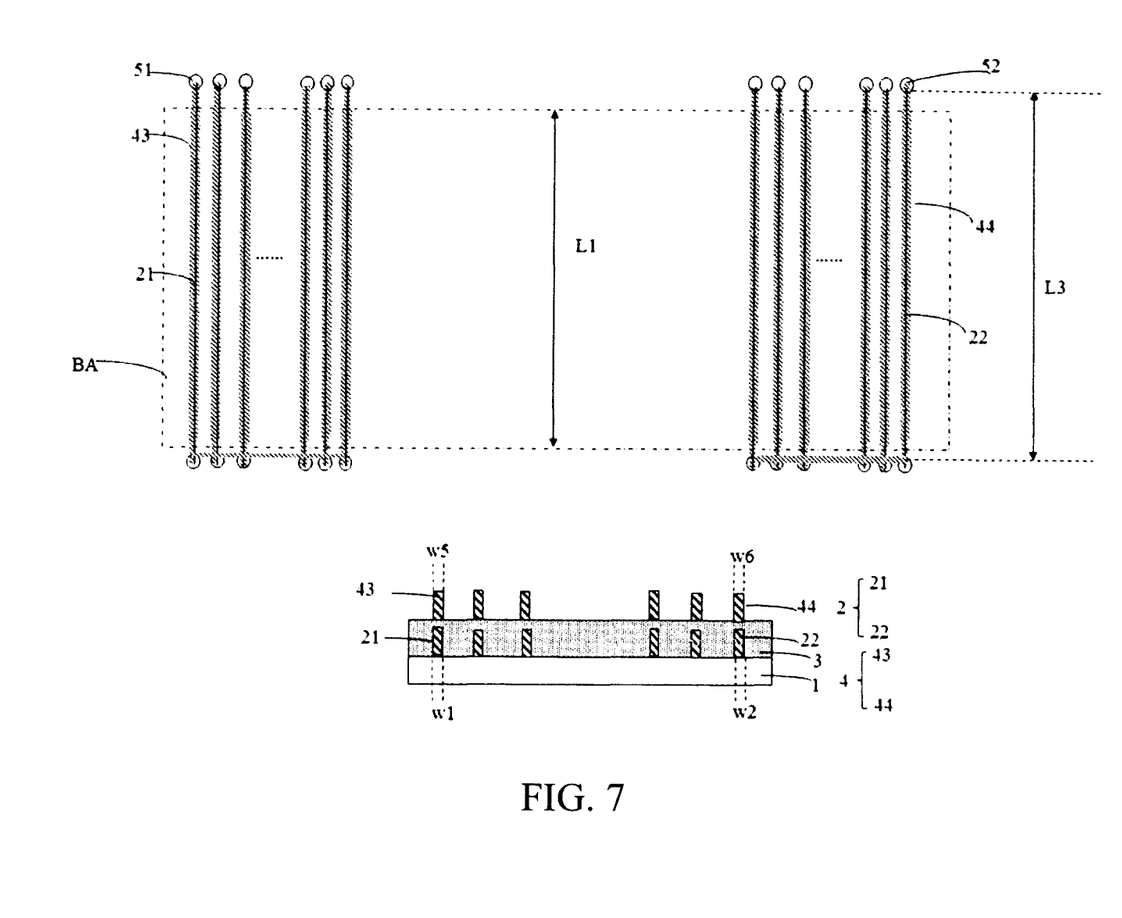
FIG. 7 is a schematic diagram of a second structure of a bending area according to an embodiment of the present disclosure.

In order to resolve the above problems, as shown in FIGS. 6 and 7, the bending area BA of the flexible display panel 10 provided in the present disclosure includes: a first flexible area 1, a first metal layer 2 disposed on the first flexible area 1, an organic insulating layer 3 disposed on the first metal layer 2, and a second metal layer 4 disposed on the organic insulating layer 3.

The first metal layer 2 includes a plurality of first traces 21 and a plurality of second traces 22. The first traces 21 are located on a first side of the bending area BA, and the second traces 22 are located on a second side of the bending area BA. The second metal layer 4 includes a plurality of metal patterns 41, 42, 43, and 44, and orthographic projections of the plurality of metal patterns 41, 42, 43, and 44 on the first flexible area 1 completely cover orthographic projections of the first traces 21 and the second traces 22 on the first flexible area 1.

In the embodiment of the present disclosure, the first flexible area 1 is a substrate made of a flexible material. The flexible material is preferably polyimide (PI). Materials of the first metal layer 2 and the second metal layer 4 may be, but is not limited to, Ti/Al/Ti. A material of the organic insulating layer 3 may be, but is not limited to, polymethyl methacrylate (PMMA), epoxy resin, phenol resin, acrylic resin, and methacrylic resin.

According to the present disclosure, by additionally disposing a second metal layer 4 above the traces in the bending area BA, the metal blocks 41 and 42 or metal wires 43 and 44 formed by patterning the second metal layer 4 correspondingly cover the traces. That is, the orthographic projections of the plurality of metal blocks 41 and 42 or the plurality of metal wires 43 and 44 on the first flexible area 1 completely cover the orthographic projections of the first traces 21 and the second traces 22 on the first flexible area 1. In this way, the interference of signal noise of the traces on the antenna of the complete machine as a result of the traces in the bending area BA incapable of being covered by the metal shielding film can be effectively reduced.

Figure 5:
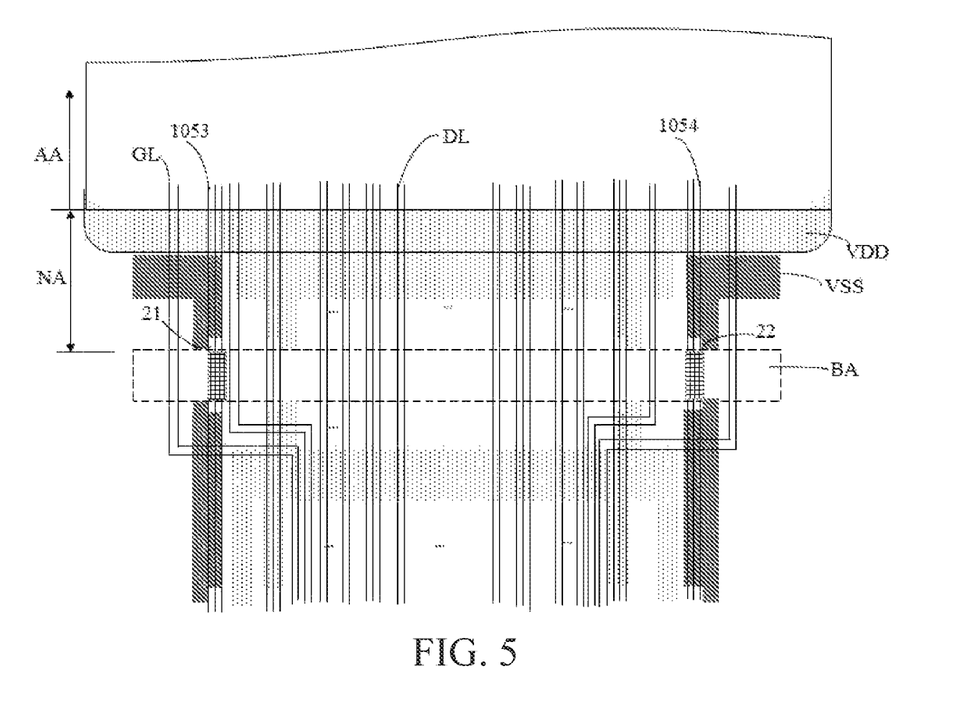
FIG. 5 is a schematic plan view of traces of a flexible display panel that are from a non-display area to a bending area according to an embodiment of the present disclosure.

As shown in FIG. 5, a plurality of lines disposed in the display area AA and the non-display area NA include a data line DL, a gate line GL, a power voltage line VDD/VSS, a third trace 1053, and a fourth trace 1054. These lines are all electrically connected to the corresponding lines on the first metal layer 2 through vias before entering the bending area BA. In the present embodiment, the third trace 1053 and the fourth trace 1054 are touch traces.

In an embodiment of the present disclosure, the first trace 21 and the second trace 22 of the bending area BA may be correspondingly connected to the third trace 1053 and the fourth trace 1054 located in the display area AA and providing electrical signals of the touch layer 105. Therefore, in the present embodiment, the shielding effect of the second metal layer 4 can effectively reduce the interference, to the antenna of the complete machine, of the signal noise of the touch traces as a result of the touch traces in the bending area BA incapable of being covered by the metal shielding layer.

Figure 3:
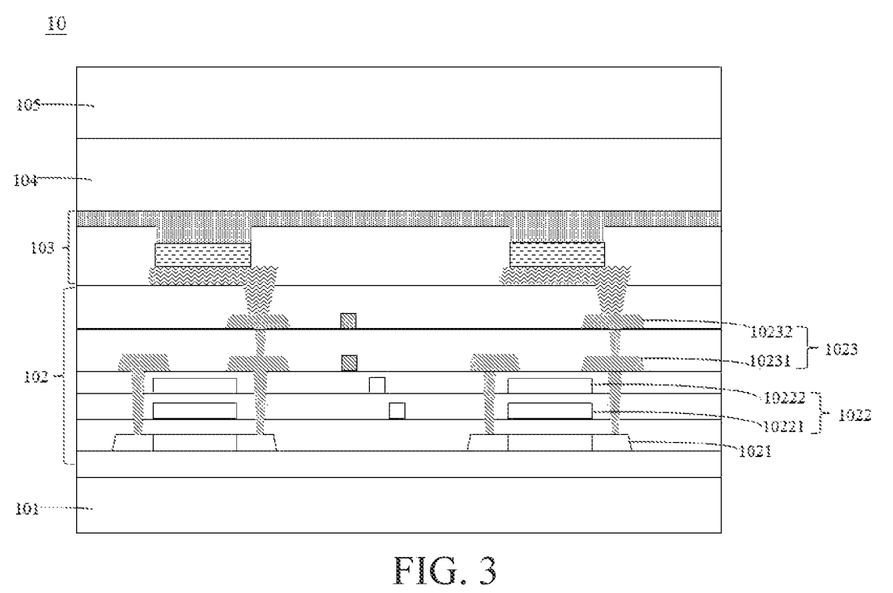
FIG. 3 is a schematic diagram of a structure of a flexible display panel in a display area according to an embodiment of the present disclosure.

As shown in FIG. 3, in the display area AA, the flexible display panel 10 includes a second flexible area 101, a circuit device layer 102, a display device layer 103, a packaging layer 104, and a touch layer 105 that are sequentially disposed from bottom to top.

The second flexible area 101 is a substrate made of a flexible material. The flexible material is preferably PI. The circuit device layer 102 includes an active layer 1021, a metal gate layer 1022, a source/drain layer 1023, and an interlayer insulating layer disposed among the active layer, the metal gate layer, and the source/drain layer, so as to form a thin film transistor.

The data line DL is located on the source/drain layer 1023, the gate line GL is located on the metal gate layer 1022, and the power voltage line VDD/VSS is located on the source/drain layer 1023.

The display device layer 103 is configured to emit light. The display device layer 103 usually includes an anode disposed on the thin film transistor, a hole injection layer (HIL) disposed on the anode, a hole transport layer (HTL) disposed on the hole injection layer, an emission layer (EML) disposed on the hole transport layer, an electron transport layer (ETL) disposed on the emission layer, an electron injection layer (EIL) disposed on the electron transport layer, and a cathode disposed on the ETL.

The EML includes a red sub-pixel unit, a green sub-pixel unit, and a blue sub-pixel unit. The red sub-pixel unit is configured to emit red light, the green sub-pixel unit is configured to emit green light, and the blue sub-pixel unit is configured to emit blue light.

The packaging layer 104 is configured to insulate the flexible display panel 10 from external water and oxygen, so as to ensure the yield of the flexible display panel 10. The packaging layer is usually a sandwich structure composed of an organic layer, an inorganic layer, and an organic layer.

Figure 4:
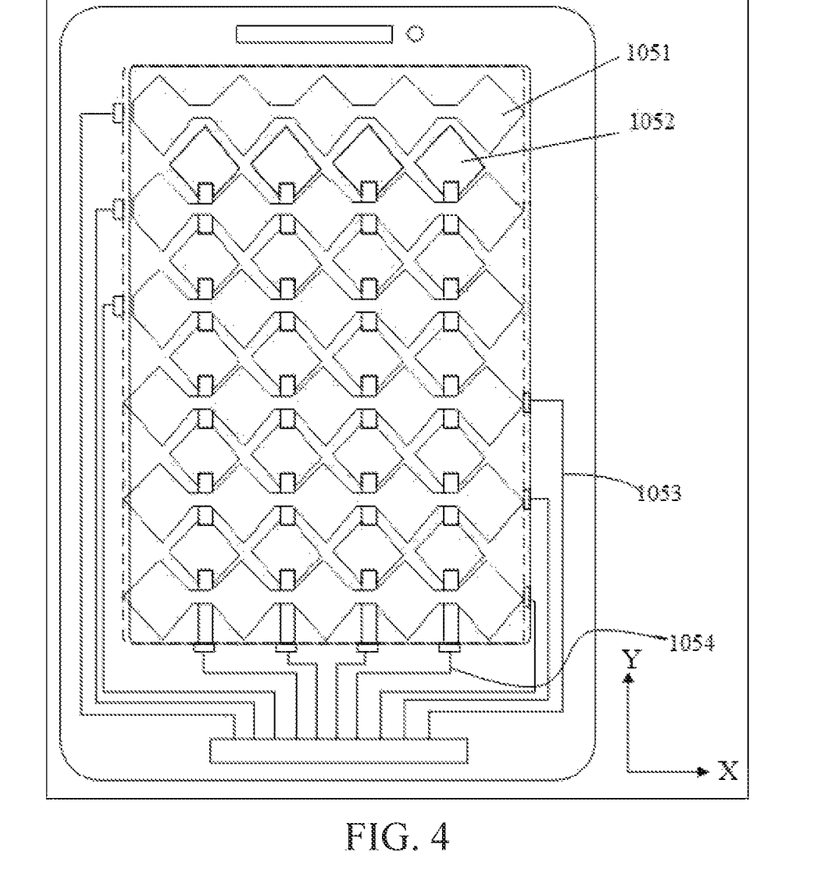
FIG. 4 is a schematic diagram of a structure of a touch layer according to an embodiment of the present disclosure.

As shown in FIG. 4, the touch layer 105 includes a plurality of first touch electrode 1051 arranged in a transverse direction and a plurality of second touch electrode 1052 arranged in a vertical direction. The first touch electrode 1051 and the second touch electrode 1052 are insulated from each other. In the first touch electrodes 1051 arranged in the transverse direction, all of the first touch electrodes 1051 on a same straight line are electrically connected in sequence using electrode wires on a same layer, so as to form a first touch line. In the second touch electrodes 1052 arranged in the vertical direction, all of the second touch electrodes 1052 on a same straight line are connected in sequence using electrode bridges, so as to form a second touch line. In the figure, the transverse direction is represented by an axis X, and the vertical direction is represented by an axis Y.

A plurality of third traces 1053 and fourth traces 1054 are disposed on a side of a touch area. The third traces 1053 are configured to electrically connect the first touch electrodes 1051, and the fourth traces 1054 are configured to electrically connect the second touch electrodes 1052.

In an embodiment of the present disclosure, the third traces 1053 are electrically connected to the first traces 21 through first vias 51 provided at an edge of the bending area BA, and the fourth traces 1054 are electrically connected to the second traces 22 through second vias 52 provided at the edge of the bending area BA.

Before the third traces 1053 and the fourth traces 1054 enter the bending area BA, the third traces 1053 are electrically connected to the first traces 21 through the first vias 51, and the fourth traces 1054 are electrically connected to the second traces 22 through the second vias 52, so that the traces can be disposed in the first metal layer 2 after entering the bending area BA.

Further, the data lines DL, the gate lines GL, or other traces for transmitting change signals in the display area may also be electrically connected to other lines located in the first metal layer 2 through other vias, thereby further reducing the interference of noise of other lines in the bending area BA to the antenna of the complete machine.

In addition, all of the lines are disposed on the first metal layer 2 in the bending area BA. Since all of the lines are located on a same layer, not only the interference of all line noise to the antenna of the complete machine can be reduced, but also signal interference therebetween can be reduced.

Furthermore, refer to FIGS. 3 and 5. In an embodiment of the present disclosure, in the display area AA, the source/drain layer 1023 includes a first source/drain layer 10231 and a second source/drain layer 10232 located above the first source/drain layer 10231. The data lines DL are located on the first source/drain layer 10231, the gate lines GL are located on the metal gate layer 1022, and the power voltage lines VDD/VSS are located on the second source/drain layer 10232.

Further, the metal gate layer 1022 may also include a first metal gate layer 10221 and a second metal gate layer 10222, so as to further prevent leakage of the thin film transistor.

Further, the first source/drain layer 10231, the second source/drain layer 10232, and the metal gate layer 1022 in the display area AA also correspondingly extend to the non-display area NA. Since the touch layer 105 does not extend to the non-display area NA, the third traces 1053 and the fourth traces 1054 may be switched to the second source/drain layer 10232 through the vias after entering the non-display area NA.

In an embodiment of the present disclosure, in the non-display area NA, the data lines DL may be switched to the metal gate layer 1022 through the vias, the gate lines GL may still be located on the metal gate layer 1022, and the power voltage lines VDD/VSS may be switched to the first source/drain layer 10231 through the vias.

The data lines DL and the gate lines GL are disposed on a lower metal layer, such as the metal gate layer 1022. The power voltage lines VDD/VSS are disposed in a middle metal layer, such as the first source/drain layer 10231. The third traces 1053 and the fourth traces 1054 are disposed on an upper metal layer, such as the second source/drain layer 10232, and correspond to the power voltage lines VDD/VSS. The power voltage lines VDD/VSS may be used to further shield the interference of display signals of the data lines DL and the gate lines GL to touch signals of the third traces and the fourth traces. In other words, in the non-display area NA, the power voltage lines VDD/VSS may serve as a metal shielding layer to shield the interference of the display signals of the data lines DL and the gate lines GL to the touch signals of the third traces 1053 and the fourth traces 1054.

It may be understood that, since the bending area is required to have a high flexibility material, the bending area BA does not have a metal film layer of the metal gate layer 1022. The structure of the metal film layer only includes the first metal layer 2 and the second metal layer 4. That is, the first metal layer 2 and the second metal layer 4 are respectively formed by extending the first source/drain layer 10231 and the second source/drain layer 10232 in the display area AA and the non-display area NA. That is, the first metal layer 2 and the first source/drain layer 10231 are simultaneously formed, and the second metal layer 4 and the second source/drain layer 10232 are simultaneously formed.

Further, when entering the bending area BA from the non-display area NA, the third traces 1053 are electrically connected to the first traces 21 through the first vias 51, and the fourth traces 1054 are electrically connected to the second traces 22 through the second vias 52, so that the third traces 1053 and the fourth traces 1054 are switched from the second source/drain layer 10232 of the non-display area NA to the first metal layer 2 of the bending area BA.

Further, the data lines DL, the gate lines GL, or other traces for transmitting change signals in the non-display area NA may also be electrically connected to other lines located in the first metal layer 2 through other vias, thereby further reducing the interference of noise of other lines in the bending area BA to the antenna of the complete machine. That is, the data lines DL and the gate lines GL may be switched from the metal gate layer 1022 of the non-display area NA to the first metal layer 2 of the bending area BA. The power voltage lines VDD/VSS may extend from the first source/drain layer 10231 of the non-display area NA to the first metal layer 2 of the bending area BA.

That is, all of the lines are disposed on the first metal layer 2 in the bending area BA. Since all of the lines are located on a same layer, not only the interference of all line noise to the antenna of the complete machine can be reduced, but also signal interference therebetween can be reduced.

Therefore, in the present embodiment, the first metal layer 2 and the second metal layer 4 in the bending area do not require an additional metal film preparation process, and may be directly formed by extending the original first source/drain layer 10231 and the second source/drain layer 10232 in the display area AA and the non-display area NA. A metal shielding layer may be disposed for the lines of the bending area BA without increasing the process steps and costs, thereby avoiding the interference between signals.

In addition, in the present disclosure, the lines located in the non-display area NA and the bending area BA are routed between the upper and lower metal film layers through vias. The first source/drain layer 10231 is used as the metal shielding layer in the non-display area NA. In the bending area, the second source/drain layer 10232 is used as the metal shielding layer, thereby making full use of the space of a lower frame. In this way, the metal shielding layer can be disposed for the lines of the non-display area NA and the bending area BA without increasing the costs, thereby avoiding the interference between signals.

In an embodiment of the present disclosure, the second metal layer 4 includes a first metal block 41 and a second metal block 42. The first metal block 41 corresponds to the first traces 21, and the second metal block 42 corresponds to the second traces 22. An orthographic projection of the first metal block 41 on the first flexible area 1 completely covers orthographic projections of the first traces 21 on the first flexible area 1, and an orthographic projection of the second metal block 42 on the first flexible area 1 completely covers orthographic projections of the second traces 22 on the first flexible area 1.

As shown in FIG. 6, an upper diagram of FIG. 6 is a plan view of the bending area BA, and a lower diagram of FIG. 6 is a schematic diagram of a cross-sectional structure in the bending area BA. It should be noted that, for convenience, other traces in the first metal layer 2 are ignored, and FIG. 6 merely shows the first traces 21 and the second traces 22.

In detail, that is, a length L2 of the first metal block 41 and a length of the second metal block 42 is greater than or equal to a bending length L1 of the bending area BA. A width w3 of the first metal block 41 is greater than or equal to a sum of widths w1 of and spacings among the plurality of first traces, and a width w4 of the second metal block 42 is greater than or equal to a sum of widths w2 of and spacings among the plurality of second traces.

It may be understood that the first metal block 41 and the second metal block 42 each are a constant potential. That is, the first metal block 41 and the second metal block 42 are connected to a grounding wire through vias and have ground potentials. Alternatively, the first metal block 41 and the second metal block 42 are respectively a constant high potential (VDD) or a constant low potential (VSS).

In other embodiments, the first traces 21 and the second traces 22 shown in FIG. 6 may also be replaced with other lines in the bending area. The other lines may be correspondingly connected to the data lines DL, the gate lines GL, other traces for transmitting change signals, or the like. By disposing other metal blocks above the other lines, the interference of other line noises in the bending area to the antenna of the complete machine can further be reduced.

In an embodiment of the present disclosure, the second metal layer 4 includes a plurality of first metal wires 43 and a plurality of second metal wires 44. Each first metal wire 43 corresponds to one first trace 21, and each second metal wire 44 corresponds to one second trace 22. Orthographic projections of the first metal wires 43 on the first flexible area 1 completely cover orthographic projections of the first traces 21 on the first flexible area 1, and orthographic projections of the second metal wires 44 on the first flexible area 1 completely cover orthographic projections of the second traces 22 on the first flexible area 1.

As shown in FIG. 7, an upper diagram of FIG. 7 is another plan view of the bending area BA, and a lower diagram of FIG. 7 is a schematic diagram of another cross-sectional structure in the bending area BA. It should be noted that, for convenience, other traces in the first metal layer 2 are ignored, and FIG. 7 merely shows the first traces 21 and the second traces 22.

In detail, that is, a length L3 of each first metal wire 43 and a length of each second metal wire 44 each are greater than or equal to a bending length L1 of the bending area. A width w5 of the each first metal wire is greater than or equal to a width w1 of each first trace corresponding to the each first metal wire, and a width w6 of the each second metal wire is greater than or equal to a width w2 of each second trace corresponding to the each second metal wire.

It may be understood that the first metal wire 43 and the second metal wire 44 each are a constant potential. That is, the first metal wire 43 and the second metal wire 44 are connected to a grounding wire through vias and have ground potentials. Alternatively, the first metal wire 43 and the second metal wire 44 are respectively a constant high potential (VDD) or a constant low potential (VSS).

In other embodiments, the first traces 21 and the second traces 22 shown in FIG. 7 may also be replaced with other lines in the bending area, such as the data lines DL, the gate lines GL, other traces for transmitting change signals, or the like. By disposing other metal wires above the other lines, the interference of other line noises in the bending area to the antenna of the complete machine can further be reduced.

In other embodiments of the present disclosure, the second metal layer 4 as a shielding layer may also include either the metal block or the metal wire. For example, in order to avoid the trace breakage caused by the bending area, the second metal layer may be matched by stress and has the metal block and metal wires. The metal block is disposed at a part having a large bending stress, and the metal wires are disposed at a part having a small bending stress.

Therefore, according to the present disclosure, by additionally disposing a second metal layer 4 above the traces in the bending area BA, the metal blocks 41 and 42 or metal wires 43 and 44 formed by patterning the second metal layer 4 correspondingly cover the traces. That is, the orthographic projections of the plurality of metal blocks 41 and 42 or the plurality of metal wires 43 and 44 on the first flexible area 1 completely cover the orthographic projections of the first traces 21 and the second traces 22 on the first flexible area 1. In this way, the interference of signal noise of the traces on the antenna of the complete machine as a result of the traces in the bending area BA incapable of being covered by the metal shielding film can be effectively reduced.

In the foregoing embodiments, the descriptions of each embodiment have different focuses, and for a part that is not described in detail in an embodiment, reference may be made to the relevant description of other embodiments.

The embodiments of the present disclosure are described in detail above. The principles and implementations of the present disclosure are described by using specific examples in the present disclosure, and the descriptions of the embodiments are merely intended to help understand the methods and core ideas of the present disclosure. A person of ordinary skill in the art should understand that modifications may be made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A flexible display panel, comprising a display area, a bending area located outside the display area, and a flexible substrate, wherein the flexible substrate defines a first flexible area located in the bending area and a second flexible area located in the display area;
   the bending area comprises:
   a first metal layer, disposed on the first flexible area;
   an organic insulating layer, disposed on the first metal layer; and
   a second metal layer, disposed on the organic insulating layer, wherein
   the first metal layer comprises a plurality of first traces and a plurality of second traces, the first traces are located on a first side of the bending area, and the second traces are located on a second side of the bending area; and
   the second metal layer includes a plurality of metal patterns, and orthographic projections of the plurality of metal patterns on the first flexible area cover orthographic projections of the first traces and the second traces on the first flexible area.

2. The flexible display panel as claimed in claim 1, wherein in the display area, the flexible display panel further comprises:
   a circuit device layer, disposed above the second flexible area;
   a display device layer, disposed above the circuit device layer;
   a packaging layer, disposed above the display device layer; and
   a touch layer, disposed above the packaging layer and comprising first touch electrodes and second touch electrodes, wherein
   the touch layer further comprises third traces electrically connected to the first touch electrodes and fourth traces electrically connected to the second touch electrodes, the third traces are electrically connected to the first traces through first vias provided at an edge of the bending area, and the fourth traces are electrically connected to the second traces through second vias provided at the edge of the bending area.

3. The flexible display panel as claimed in claim 1, wherein the metal patterns comprise a first metal block and a second metal block, the first metal block corresponds to the first traces, and the second metal block corresponds to the second traces; and an orthographic projection of the first metal block on the first flexible area completely covers the orthographic projections of the first traces on the first flexible area, and an orthographic projection of the second metal block on the first flexible area completely covers the orthographic projections of the second traces on the first flexible area.

4. The flexible display panel as claimed in claim 3, wherein a length of the first metal block and a length of the second metal block each are greater than or equal to a bending length of the bending area, a width of the first metal block is greater than or equal to a sum of widths of and spacings among the plurality of first traces, and a width of the second metal block is greater than or equal to a sum of widths of and spacings among the plurality of second traces.

5. The flexible display panel as claimed in claim 1, wherein the metal patterns comprise a plurality of first metal wires and a plurality of second metal wires, each first metal wire corresponds to one first trace, and each second metal wire corresponds to one second trace; orthographic projections of the first metal wires on the first flexible area completely cover the orthographic projections of the first traces on the first flexible area, and orthographic projections of the second metal wires on the first flexible area completely cover the orthographic projections of the second traces on the first flexible area.

6. The flexible display panel as claimed in claim 5, wherein a length of each first metal wire and a length of each second metal wire each are greater than or equal to a bending length of the bending area, a width of the each first metal wire is greater than or equal to a width of each first trace corresponding to the each first metal wire, and a width of the each second metal wire is greater than or equal to a width of each second trace corresponding to the each second metal wire.

7. The flexible display panel as claimed in claim 1, wherein each metal pattern has a constant potential.

8. The flexible display panel as claimed in claim 2, wherein the circuit device layer located in the display area comprises a metal gate layer, a first source/drain layer disposed on the metal gate layer, and a second source/drain layer disposed on the first source/drain layer, wherein in the bending area, the first metal layer is formed by extending the first source/drain layer, and the second metal layer is formed by extending the second source/drain layer.

9. The flexible display panel as claimed in claim 8, further comprising a non-display area located between the display area and the bending area, wherein the non-display area comprises the metal gate layer, the first source/drain layer, and the second source/drain layer that extend from the display area; and in the non-display area, data lines or gate lines are disposed on the metal gate layer, power voltage lines are disposed on the first source/drain layer, the third traces and the fourth traces are disposed on the second source/drain layer, and the third traces and the fourth traces are disposed corresponding to the power voltage lines.

10. The flexible display panel as claimed in claim 1, wherein the metal patterns comprise metal blocks and metal wires.

11. A display device, comprising a flexible display panel and a main board disposed below the flexible display panel, wherein the flexible display panel comprises a display area and a bending area located outside the display area, and the bending area comprises:
a first flexible area;
a first metal layer, disposed on the first flexible area;
an organic insulating layer, disposed on the first metal layer; and
a second metal layer, disposed on the organic insulating layer, wherein
the first metal layer comprises a plurality of first traces and a plurality of second traces, the first traces are located on a first side of the bending area, and the second traces are located on a second side of the bending area; and
the second metal layer comprises a plurality of metal patterns, and orthographic projections of the plurality of metal patterns on the first flexible area covers orthographic projections of the first traces and the second traces on the first flexible area; and
an antenna is disposed on the main board, and the antenna corresponds to the bending area.

12. The display device as claimed in claim 11, wherein in the display area, the flexible display panel further comprises:
a circuit device layer, disposed above the second flexible area;
a display device layer, disposed above the circuit device layer;
a packaging layer, disposed above the display device layer; and
a touch layer, disposed above the packaging layer and comprising first touch electrodes and second touch electrodes, wherein
the touch layer further comprises third traces electrically connected to the first touch electrodes and fourth traces electrically connected to the second touch electrodes, the third traces are electrically connected to the first traces through first vias provided at an edge of the bending area, and the fourth traces are electrically connected to the second traces through second vias provided at the edge of the bending area.

13. The display device as claimed in claim 11, wherein the metal patterns comprise a first metal block and a second metal block, the first metal block corresponds to the first traces, and the second metal block corresponds to the second traces; and an orthographic projection of the first metal block on the first flexible area completely covers the orthographic projections of the first traces on the first flexible area, and an orthographic projection of the second metal block on the first flexible area completely covers the orthographic projections of the second traces on the first flexible area.

14. The display device as claimed in claim 13, wherein a length of the first metal block and the second metal block is greater than or equal to a bending length of the bending area, a width of the first metal block is greater than or equal to a sum of widths of and spacings among the plurality of first traces, and a width of the second metal block is greater than or equal to a sum of widths of and spacings among the plurality of second traces.

15. The display device as claimed in claim 11, wherein the metal patterns comprise a plurality of first metal wires and a plurality of second metal wires, each first metal wire corresponds to one first trace, and each second metal wire corresponds to one second trace; and orthographic projections of the first metal wires on the first flexible area completely cover the orthographic projections of the first traces on the first flexible area, and orthographic projections of the second metal wires on the first flexible area completely cover the orthographic projections of the second traces on the first flexible area.

16. The display device as claimed in claim 15, wherein a length of each first metal wire and a length of each second metal wire each are greater than or equal to a bending length of the bending area, a width of the each first metal wire is greater than or equal to a width of each first trace corresponding to the each first metal wire, and a width of the each second metal wire is greater than or equal to a width of each second trace corresponding to the each second metal wire.

17. The display device as claimed in claim 11, wherein each metal pattern has a constant potential.

18. The display device as claimed in claim 12, wherein the circuit device layer located in the display area comprises a metal gate layer, a first source/drain layer disposed on the metal gate layer, and a second source/drain layer disposed on the first source/drain layer; and in the bending area, the first metal layer is formed by extending the first source/drain layer, and the second metal layer is formed by extending the second source/drain layer.

19. The display device as claimed in claim 18, wherein the flexible display panel further comprises a non-display area located between the display area and the bending area, and the non-display area comprises the metal gate layer, the first source/drain layer, and the second source/drain layer that extend from the display area; and in the non-display area, data lines or gate lines are disposed on the metal gate layer, power voltage lines are disposed on the first source/drain layer, the third traces and the fourth traces are disposed on the second source/drain layer, and the third traces and the fourth traces are disposed corresponding to the power voltage lines.

20. The display device as claimed in claim 11, wherein the metal patterns comprise metal blocks and metal wires.

* * * * *